(12) United States Patent
Jiang et al.

(10) Patent No.: US 9,949,366 B2
(45) Date of Patent: *Apr. 17, 2018

(54) TOUCH PANEL

(71) Applicant: TPK Touch Solutions (Xiamen) Inc., Xiamen (CN)

(72) Inventors: Yau-Chen Jiang, Jhubei (TW); Yanjun Xie, Wuhan (CN); Bixin Guan, Zhangping (CN); Limei Huang, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 49 days.

This patent is subject to a terminal disclaimer.

(21) Appl. No.: 15/015,139

(22) Filed: Feb. 4, 2016

(65) Prior Publication Data
US 2016/0242276 A1    Aug. 18, 2016

Related U.S. Application Data

(63) Continuation of application No. 13/956,387, filed on Aug. 1, 2013, now Pat. No. 9,287,068.

(30) Foreign Application Priority Data

Aug. 14, 2012  (CN) .......................... 2012 1 0288973

(51) Int. Cl.
*G06F 3/041* (2006.01)
*H05K 1/02* (2006.01)
*G06F 3/044* (2006.01)
*G06F 3/0488* (2013.01)
*H01H 13/86* (2006.01)

(52) U.S. Cl.
CPC ........... *H05K 1/0274* (2013.01); *G06F 3/041* (2013.01); *G06F 3/044* (2013.01); *G06F 3/0488* (2013.01); *H01H 13/86* (2013.01); *H05K 1/0296* (2013.01)

(58) Field of Classification Search
CPC ............................... G06F 3/041; H01H 13/86
See application file for complete search history.

(56) References Cited

U.S. PATENT DOCUMENTS

| 7,656,393 B2 * | 2/2010 | King | G06F 1/1626 |
| | | | 345/156 |
| 2009/0140994 A1 * | 6/2009 | Tanaka | H01H 13/83 |
| | | | 345/173 |

* cited by examiner

*Primary Examiner* — Towfiq Elahi
(74) *Attorney, Agent, or Firm* — Paul David Bendemire

(57) ABSTRACT

A touch panel includes a protective cover with a lower surface herein, and an active region and a periphery region defined on the lower surface. A first sensing structure is disposed on the lower surface and covers the active region. A shelter layer is disposed on the lower surface and in the periphery region, wherein the shelter layer includes a highlight region and a highlight contrast region, a first pattern is disposed in the highlight region, and a non-transparent layer with a second pattern is disposed in the highlight region, wherein the first pattern is overlapped by the second pattern.

20 Claims, 6 Drawing Sheets

TOUCH PANEL

CROSS-REFERENCE TO RELATED APPLICATIONS

The current application is a Continuation application of U.S. application Ser. No. 13/956,387 filed on Aug. 1, 2013 which claims the benefit of the People's Republic of China Application No. 201210288973.0, filed on Aug. 14, 2012. The entire contents of the above-referenced applications are incorporated herein by reference.

BACKGROUND OF THE INVENTION

Field of the Invention

The present invention, generally relates to field of touch technologies, and more particularly to a touch technology for touch panels.

Description of Related Art

Nowadays, personal digital assistants (FDA), mobile phones, notebook computers, tablet PCs and other portable electronic products are being widely used in modern life. Since these electronic products need to be thinner and lighter in weight, the traditional input devices, such as keyboards or a mouse, have to be replaced with other input devices. In addition, as the need for tablet PCs has greatly increased, the touch panel technology has become one of the key components in the manufacturing of electronic products. Furthermore, since electronic products with light, thin and short forms have become a mainstream development trend, allowed space in these new-developed electronic products is no longer enough to accommodate conventional input devices such as key boards or mice.

Generally, a conventional touch panel includes an active region and a peripheral region having an opaque shelter layer surrounding the active region. In some products, a function key module is configured within the peripheral region and a portion of the corresponding shelter layer is etched away to form corresponding key icons. Since light emitting diodes (LED) are usually disposed under the shelter layer and corresponding to the key icons, light beams from the LEDs are emitted on the key icons so that a viewer is able to see the vivid key icons. The shelter layer, however, is often fabricated through printing or coating processes. Due to technical limitations in printing or coating processes, drawbacks such as uneven coating of the shelter layer or small bubbles within the shelter layer often, occur unavoidably, which thereby incurs pinholes formed in the shelter layer. In a normal condition, these pinholes are hardly visible to a viewer, but in a case when light beams from the LEDs are emitted on the shelter layer close to the key icons, the light beams will be transmitted through these pinholes and let these pinholes be visible to the viewer thereby inducing negative effects in the product's appearance.

SUMMARY OF THE INVENTION

In light of the above, the present invention provides a touch panel with a non-transparent layer, which is able to resolve the drawbacks caused by the pinholes and thus improve the product's appearance.

In one aspect of the present invention, the present invention provides a touch panel which includes a protective cover, a first sensing structure, a shelter layer and a non-transparent layer. The protective cover has a lower surface which includes an active region and a peripheral region surrounding the active region. The first sensing structure is disposed on the lower surface and covers the active region. The shelter layer is disposed on the lower surface within the peripheral region and includes a highlight region and a highlight contrast region, wherein a first pattern is disposed in the highlight region. And the non-transparent layer is disposed on the shelter layer within the highlight region, wherein a second pattern is formed on the non-transparent layer and overlapped by the first pattern.

The present invention provides a non-transparent layer within a highlight region of a peripheral region in order to shelter a certain region from the light beams. In this way, pinholes existing in the shelter layer will hardly be visible to the eyes and the appearance of the products is therefore improved.

These and other objectives of the present invention will no doubt become obvious to those of ordinary skill in the art after reading the following detailed description of the preferred embodiment that is illustrated in the various figures and drawings.

It should be noted that all the figures are for illustration only. Relative dimensions and proportions of parts of the drawings are exaggerated or reduced in size, for the sake of clarity and convenience. The same reference numbers are generally used to refer to corresponding or similar features in modified and different embodiments.

DETAILED DESCRIPTION OF THE INVENTION

In the following description, numerous specific details are given to provide a thorough understanding of the invention. It will, however, be apparent to skilled person in the art, that the invention may be practiced without these specific details. Furthermore, some well-known system configurations and process steps are not disclosed in detail, as these should be well-known to those skilled in the art.

Figure 1:
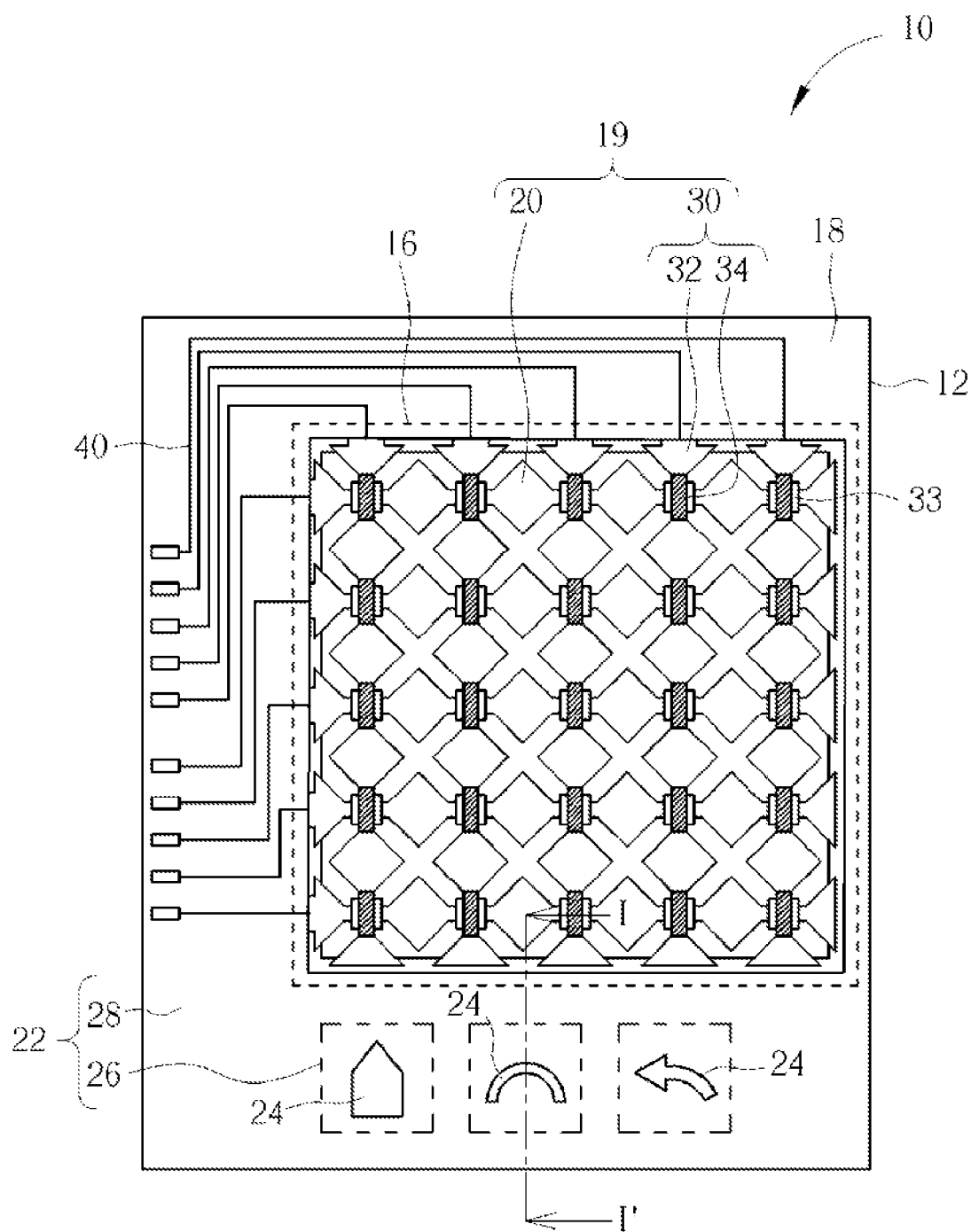
FIG. 1 is a schematic diagram showing a top-view of a touch panel according to a first preferred embodiment of the present invention.

FIG. 1 is a schematic, top-view showing a touch panel according to a first embodiment of the present invention. Referring to FIG. 1, a touch panel 10 disclosed in the present invention includes a protective cover 12, such as a reinforced cover glass. An active region 16 and a peripheral region 18 surrounding the active region 16 are defined on the protective cover 12. A first sensing structure 19 is disposed on a lower surface of the protective cover 12 and covers the active region 16. In this embodiment, the first sensing structure 19 includes a plurality of parallel first axis electrodes 20 extending along a first direction (i.e. X-axis in this embodiment), and a plurality of parallel second axis electrodes 30 extending along a second direction (i.e. Y-axis in this embodiment). In addition, each of the second axis electrodes 30 includes a plurality of conductive units 32 and at least a connection line 34 used to electrically connect two adjacent conductive units 32. An isolation layer 33 is disposed in an overlapped region between each first axis electrode 20 and each second axis electrode 30 in order to prevent mutual electrical interference between them. A plurality of conductive lines 40 is disposed within the peripheral region 18. In this embodiment, one distal end of each conductive line 40 is electrically connected to the first axis electrode 20 or the second axis electrode 30, while another distal end of each conductive line 40 is electrically connected to an external microprocessor (not shown). The function of the microprocessor is to accept and analyze the signal transmitted by the touch panel.

Figure 2:
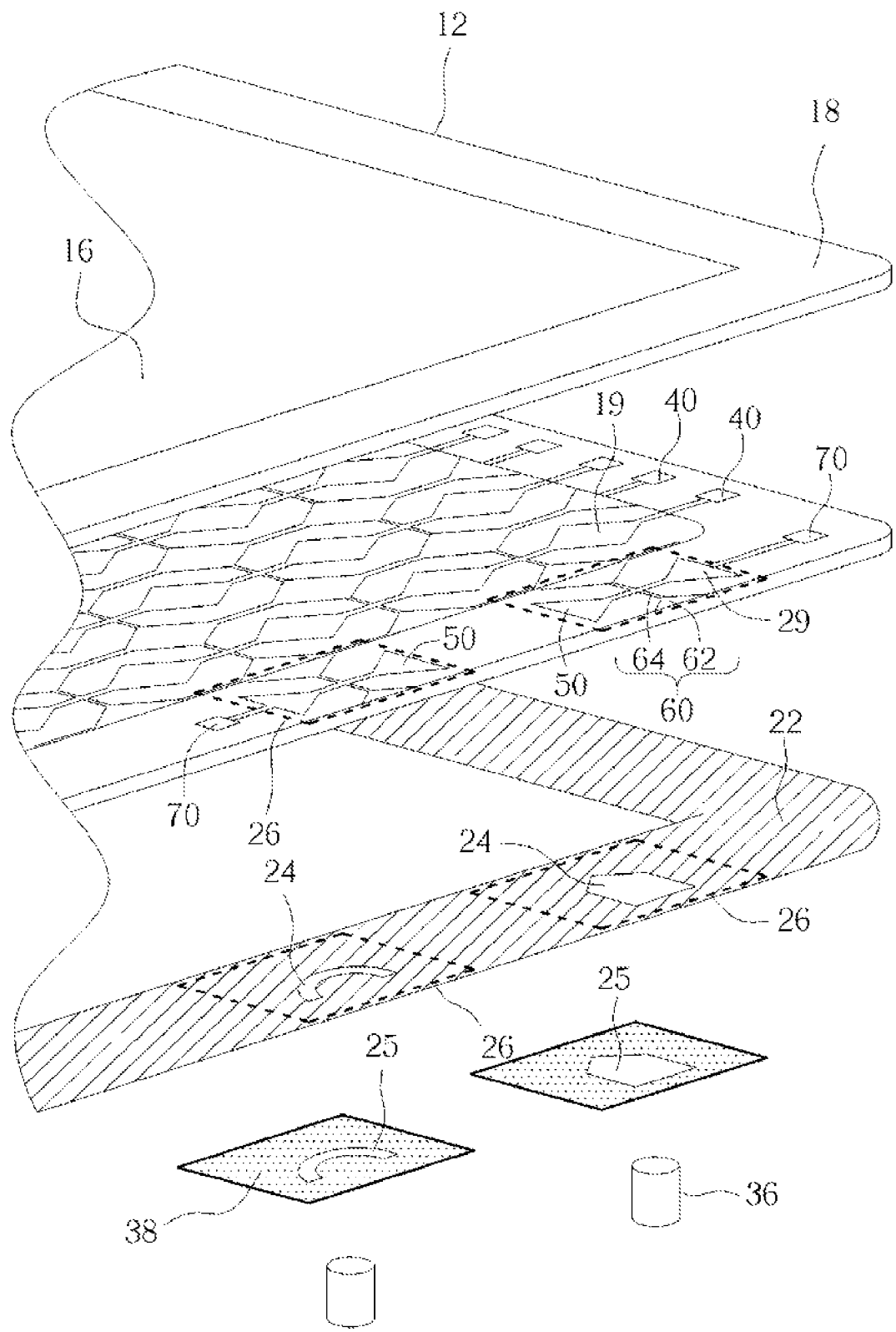
FIG. 2 is a schematic, exploded diagram showing a portion of a touch panel according to the first preferred embodiment of the present invention.

Referring to FIGS. 1 and 2, the touch panel 10 further includes a shelter layer 22 consisting of black photoresists or other opaque materials, which may be formed through, for example, printing or coating processes. The shelter layer 22 is disposed on the lower surface of the protective cover 12 and within the peripheral region 18. A first pattern 24, such as a key icon of a key module within the peripheral region of the touch panel, is formed on the shelter layer 22 through an etching process. The first pattern 24 is a hollow portion of the shelter layer 22 so that it is transparent. According to this embodiment of the present invention, a plurality of light sources, such as light emitting diodes (LEDs) (not shown), is disposed under the first pattern 24. A region in the shelter layer 22 corresponding to each light source is defined as a highlight region 26. In contrast, a region in the shelter layer 22 not corresponding to each light source is defined as a highlight contrast region 26. That is to say, at least a light source is disposed under the highlight region 26 so that light beams from the light source can transmit through the first pattern 24 and therefore shows a shining key icon.

Figure 3:
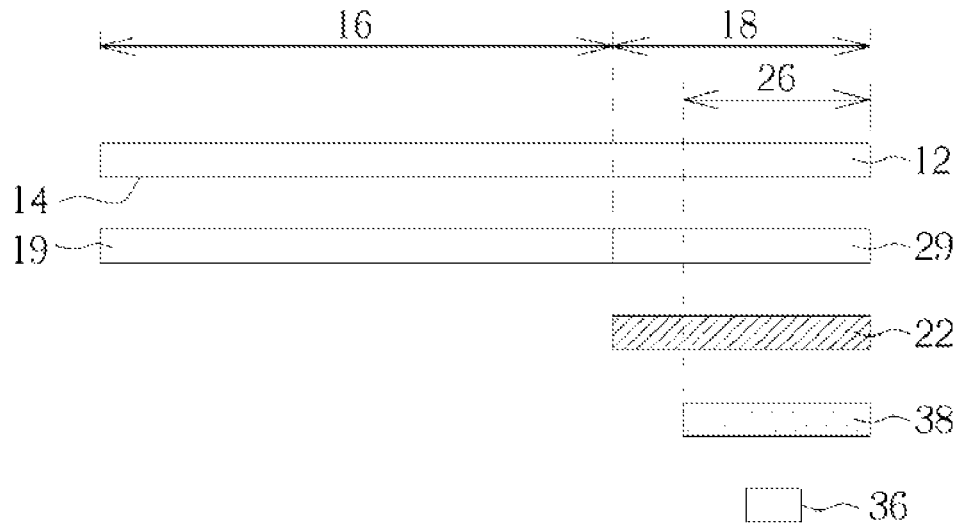
FIG. 3 is a schematic, cross-sectional diagram showing a touch panel according to the first preferred embodiment of the present invention.

Due to limitations in forming a shelter layer in conventional technologies, such as uneven coating or poor printing processes, pinholes are often formed in the shelter layer. These pinholes are hardly visible in a normal condition. However, when the shelter layer within a highlight region is exposed to light beams from the light source, the light transmit through the pinholes and let these pinholes be visible to the viewer. Accordingly, the appearance of the products is negatively affected. In order to overcome these problems, according to embodiments of the present invention, a non-transparent layer is further disposed between the shelter layer and the light sources. The non-transparent layer is able to prevent light from being transmitted through the pinholes of the shelter layer, thereby making the pinholes hardly visible to the eyes. Then, please refer to FIGS. 2 and 3. FIG. 2 is a schematic, exploded diagram showing a portion of a touch panel according to the first preferred embodiment of the present invention. FIG. 3 is a schematic, cross-sectional diagram showing a touch panel taken along a line I-I' in FIG. 1. As shown in FIGS. 2 and 3, the protective cover 12 has a lower surface 14, wherein a first sensing structure 19 is formed within the active region 16 and the shelter layer 22 is formed within the peripheral region 18. In addition, a light source 36 is disposed under the shelter layer 22 corresponding to the highlight region 26.

Furthermore, according to this embodiment, a non-transparent layer 38 is further disposed between the light source 36 and the shelter layer 22. The composition of the non-transparent layer 38 may be any kind of opaque material. A second pattern 25 is formed on the non-transparent layer 38, wherein the second pattern 25 and the first pattern 24 have the same size and are overlapped by the first pattern 24. In other embodiment, the area of the second pattern 25 is larger than that of the first pattern 24. Light beams from the underneath light source 36 may pass sequentially through the second pattern 25 and the first pattern 24 to show a key icon in user interface. Since the non-transparent layer 38 is disposed underneath the pinholes close to the first pattern 24, the non-transparent layer 38 is able to shelter light beams from being transmitted through the pinholes of the shelter layer 22, thereby letting the pinholes to be hardly visible to the eyes.

Referring to FIGS. 2 and 3, when a key module of the touch panel requires touch functionality, at least a second sensing structure 29 will be formed within the highlight region 26. The purpose of the second sensing structure 29 is to provide a key within the peripheral region 18 of the touch panel 10 with touch functionality. In this embodiment, the second sensing structure 29 includes at least a first axis electrode 50 and at least a second axis electrode 60, wherein the second axis electrode 60 includes a plurality of conductive units 62 and at least a connection line 64 used to electrically connect two adjacent conductive units 62. A plurality of conductive lines 70 may respectively be electrically connected to the first axis electrode 50 and the second axis electrode 60. The structure of the second sensing structure 29 is similar to that of the first sensing structure and the detailed description of which is therefore omitted for the sake of brevity. The second sensing structure 29 is located within the highlight region 26 and disposed between the protective cover 12 and the shelter layer 22. Since the second sensing structure 29 consists of transparent material, light beams from the light sources 36 will not be sheltered. Additionally, the second sensing structure 29 and the first sensing structure 19 are located on a same level and are electrically in contact with each other. That is to say, the second sensing structure 29 may be regarded as an extended portion of the first sensing structure 19 extending from the active region 16 to the highlight region 26. Accordingly, the second sensing structure 29 and the first sensing structure 19 may preferably be fabricated in a same process for the benefit of costs reduction. However, the second sensing structure 29 and the first sensing structure 19 may also be fabricated through different processes, if required. Besides, if the first pattern 24 within the peripheral region 18 of the touch panel 10 is used only as an icon rather than as a key, the process for fabricating the second sensing structure 29 may also be omitted.

In this embodiment, the first axis electrode 20 and the second axis electrode 30 of the first sensing structure 19 and the second sensing structure 29 mainly comprise a transparent conductive film. For example, the material includes indium tin oxide (ITO), indium zinc oxide (IZO), cadmium tin oxide (CTO), aluminum zinc oxide (AZO), indium tin zinc oxide (ITZO), tin oxide (SnO), zinc oxide (ZnO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO) etc, further including nano-particle materials such as carbon nanotube (CNT), carbon nanotube decorated with silver nano particles or carbon nanotube decorated with copper nano particles etc, but not limited thereto.

Numerous embodiments according to the present invention will be described in detail in the following paragraph. For the sake of convenience and brevity, the description in the following paragraphs is mainly focused on the differences between each embodiment. In addition, for ease of illustration and description thereof, like or similar features among various embodiments are often denoted with the same reference numbers.

Figure 4:
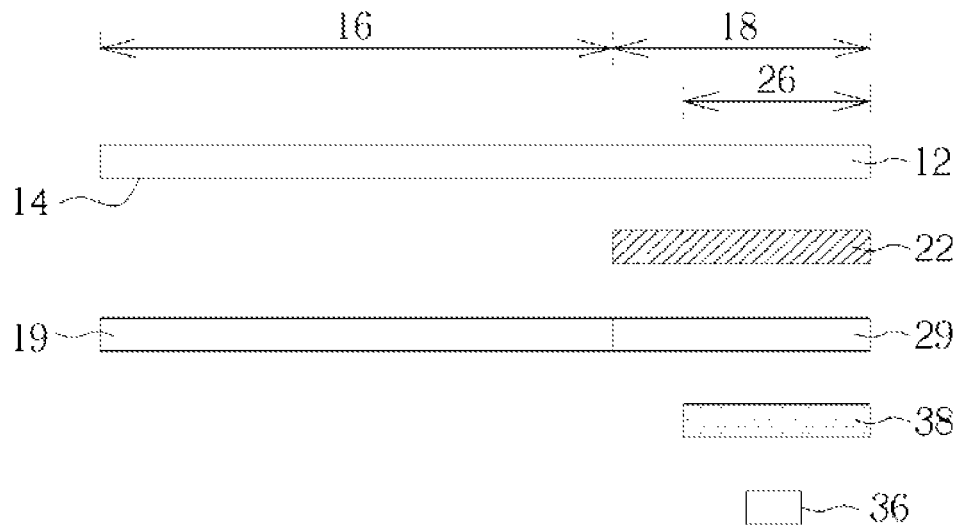
FIG. 4 is a schematic, cross-sectional diagram showing a touch panel according to a second preferred embodiment of the present invention.

FIG. 4 is a schematic, cross-sectional diagram according to a second preferred embodiment of the present invention. The second sensing structure 29 described in the first preferred embodiment is disposed between the protective cover 12 and the shelter layer 22. In contrast, the second sensing structure 29 described in the second preferred embodiment is not disposed at this position. As shown in FIGS. 2 and 4, in comparison with the first preferred embodiment, the protective cover 12 disclosed in the second preferred embodiment also has a lower surface 14, where a first sensing structure 19 within the active region 16 and the shelter layer 22 within the peripheral region 18 are respectively formed. At least a first pattern 24 is formed in the shelter layer 22. In addition, a light source 36 is disposed underneath the shelter layer 22 and correspondingly to the highlight region 26. A non-transparent layer is further disposed between the light source 36 and the shelter layer 22. The composition of the non-transparent layer 38 may include any kind of opaque material. A second pattern 25 is formed on the non-transparent layer 38, wherein the second pattern 25 and the first pattern 24 have the same size and are overlapped by the first pattern 24. In other embodiment the area of the second pattern 25 is larger than that of the first pattern 24. One difference between the first preferred embodiment and the second preferred embodiment is that the second sensing structure 29 according to this embodiment is disposed between the shelter layer 22 and the non-transparent layer 38 and within the highlight region 26. In one preferred embodiment, the second sensing structure 29 may be regarded as an extended portion of the first sensing structure 19 so that the second sensing structure 29 and the first sensing structure 19 are located on a same level and are electrically in contact with each other. Therefore, according to this embodiment, the first sensing structure 19 and the second sensing structure 29 are formed after the shelter layer 22 is already formed within the peripheral region 18. The rest of the parts disclosed in this embodiment, as well as the characteristics of other parts, material properties and the way of fabricating, are almost similar to those described in the first preferred embodiment. For the sake of brevity, these similar configurations and properties are therefore not disclosed again in detail.

Figure 5:
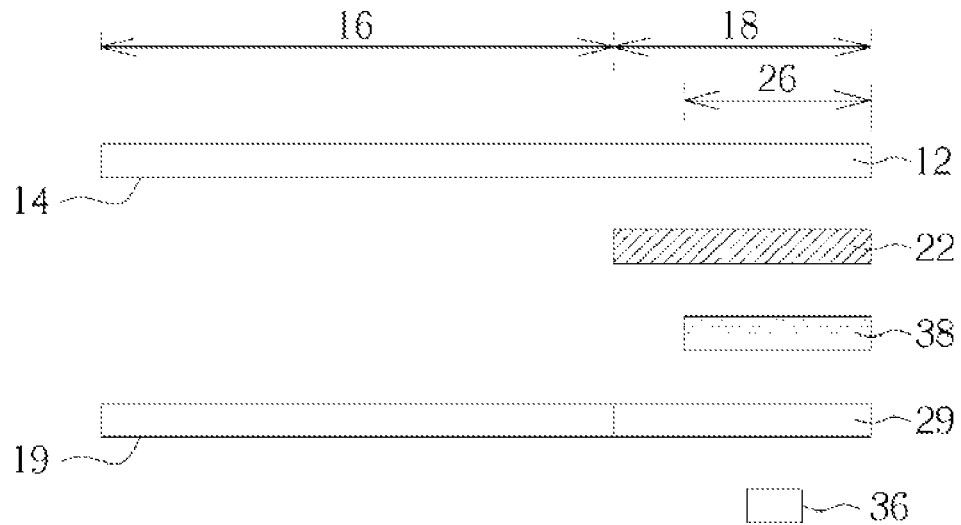
FIG. 5 is a schematic, cross-sectional diagram showing a touch panel according to a third preferred embodiment of the present invention.

FIG. 5 is a schematic, cross-sectional diagram showing a touch panel according to a third preferred embodiment of the present invention. One difference between the first preferred embodiment and the third preferred embodiment is that the second sensing structure 29 according to the third preferred embodiment is disposed underneath the non-transparent layer 38 corresponding to the highlight region 26 of the shelter layer 22. In one preferred embodiment, the second sensing structure 29 may be regarded as an extended portion of the first sensing structure 19 so that the second sensing structure 29 and the first sensing structure 19 are located on the same level and are electrically in contact with each other. Therefore, according to this embodiment, the first sensing structure 19 and the second sensing structure 29 are formed after the shelter layer 22 is formed within the peripheral region 18 and the non-transparent layer 38 is formed within the highlight region 26. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

Figure 6:
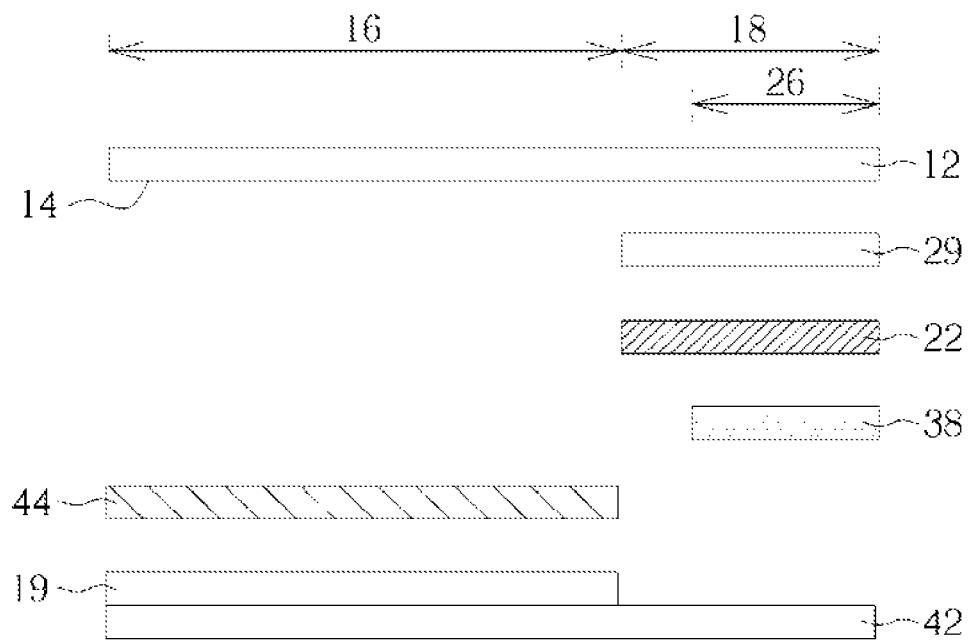
FIG. 6 is a schematic, cross-sectional diagram showing a touch panel according to a fourth preferred embodiment of the present invention.

In the above-mentioned embodiments, the first sensing structure 19 and the second sensing structure 29 are directly formed on the protective cover 12. This structure, without any substrate to support the first sensing structure 19 and the second sensing structure 29, is also called Touch On Lens (TOL) structure. According to another embodiment, however, a touch panel of the present invention may also have another substrate in order to support the first sensing structure 19 and the second sensing structure 29. FIG. 6 is a schematic, cross-sectional diagram showing a touch panel according to a fourth preferred embodiment of the present invention. Referring to FIG. 6, a touch panel according to the fourth preferred embodiment includes a substrate 42 and a protective cover 12. An active region 16 and a peripheral region 18 are defined on the protective cover 12. A shelter layer 22 is formed on the protective cover 12 corresponding to the peripheral region 18. At least a highlight region 26 is defined within the shelter region 22 and at least a non-transparent layer 38 is formed within the highlight region 26 between the shelter layer 22 and the substrate 42. The difference between the first preferred embodiment and the fourth preferred embodiment is that the substrate 42, according to the fourth embodiment, is disposed under the non-transparent layer 38 and the first sensing structure 19 is formed on the substrate 42 rather than on the protective cover 12. Additionally, the second sensing structure 29 according to this embodiment is disposed between the protective cover 29 and the shelter layer 22. In one preferred embodiment, the second sensing structure 29 may be regarded as an extended portion of the first sensing structure 19 so that the second sensing structure 29 and the first sensing structure 19 are located on the same level and are electrically in contact with each other. In this embodiment, an adhesive layer 44 is further disposed between the first sensing structure 19 and the protective cover 12 in order to have the protective cover 12 adhere to the substrate 42. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

Figure 7:
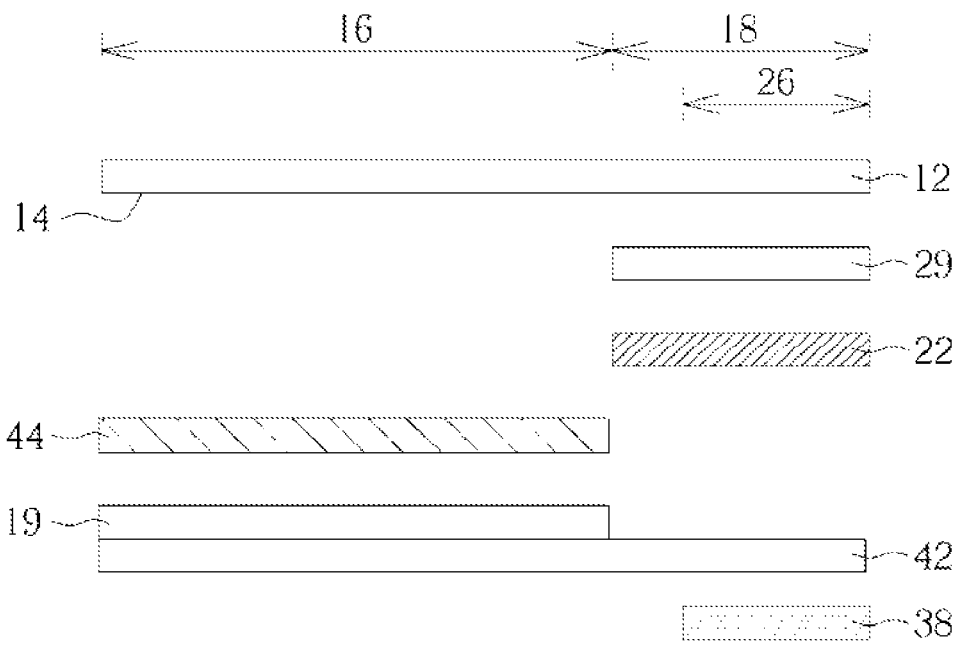
FIG. 7 is a schematic, cross-sectional diagram showing a touch panel according to a fifth preferred embodiment of the present invention.

According to the present invention, a position of the substrate 42 and the second sensing structure 29 are not limited to that disclosed in the previous embodiments. Various embodiments are described in the following paragraph accompanied with FIGS. 7-10. The main difference among these embodiments is in the position of the substrate 42 and the second sensing structure 29. FIG. 7 is a schematic, cross-sectional diagram showing a touch panel according to a fifth preferred embodiment of the present invention. Please refer to FIG. 7; one difference between the fourth preferred embodiment and the fifth preferred embodiment is that the substrate 42, according to the fifth preferred embodiment, is disposed between the shelter layer 22 and the non-transparent layer 38. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

Figure 8:
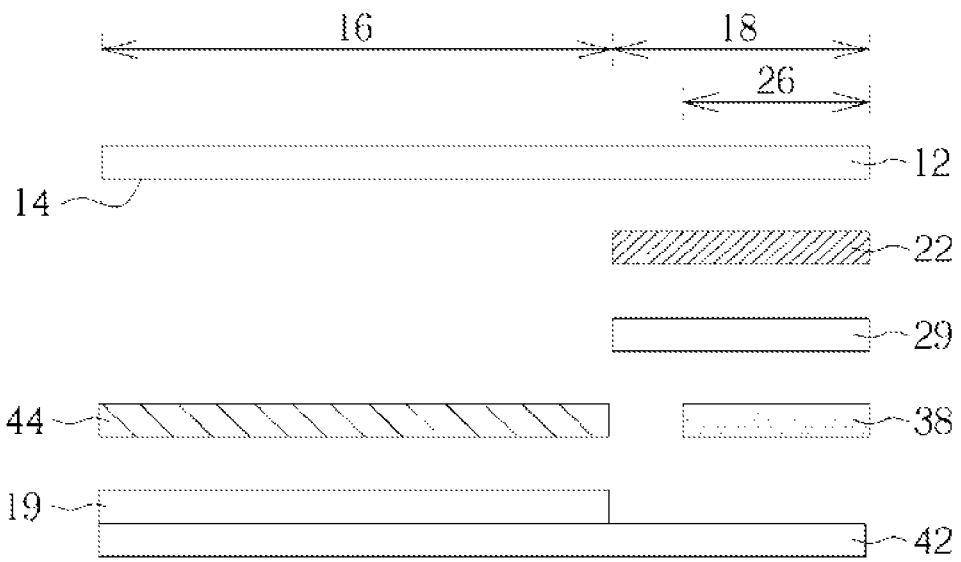
FIG. 8 is a schematic, cross-sectional diagram showing, a touch panel according to a sixth preferred embodiment of the present invention.

FIG. 8 is a schematic, cross-sectional diagram showing a touch panel according to a sixth preferred embodiment of the present invention. One difference between the fourth preferred embodiment and the sixth preferred embodiment is that the substrate 42, according to the sixth preferred embodiment, is disposed under the non-transparent layer 38 and the second sensing structure 29 is formed between the shelter layer 22 and the non-transparent layer 38. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

Figure 9:
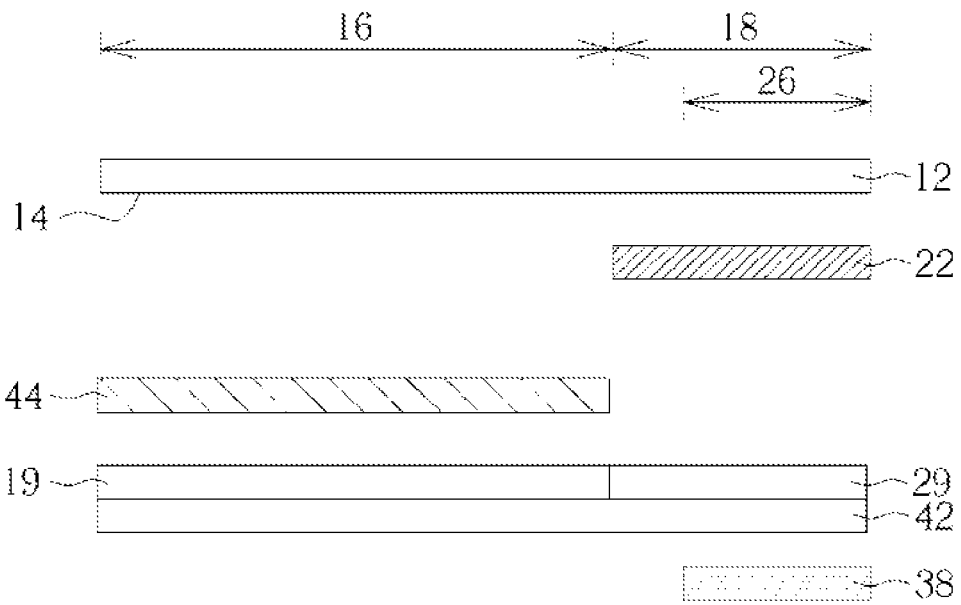
FIG. 9 is a schematic, cross-sectional diagram showing a touch panel according to a seventh preferred embodiment of the present invention.

FIG. 9 is a schematic, cross-sectional diagram showing a touch panel according to a seventh preferred embodiment of the present invention. One difference between the fourth preferred embodiment and the seventh preferred embodiment is that the substrate 42 and the second sensing structure 29 according to the seventh embodiment, are disposed between the shelter layer 22 and the non-transparent layer 38. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

Figure 10:
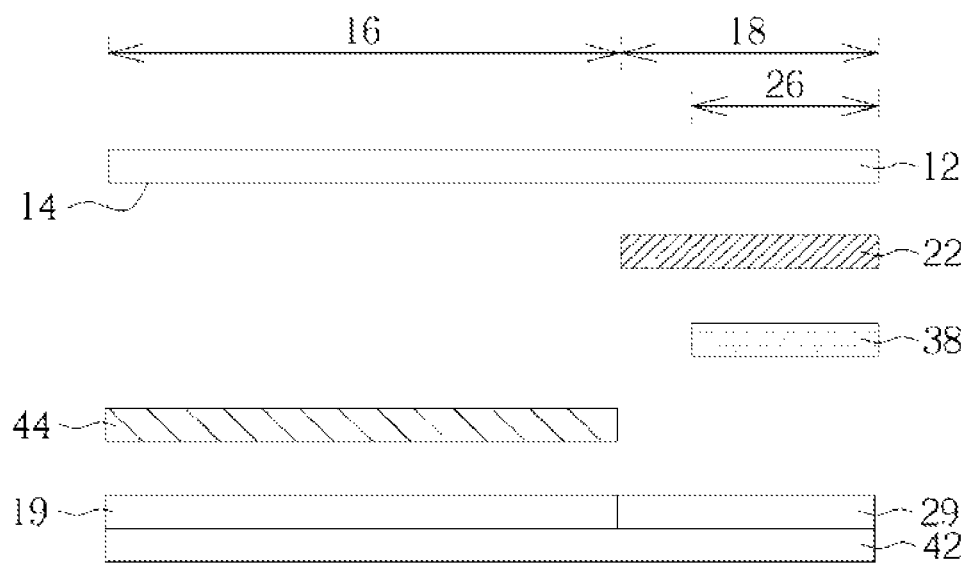
FIG. 10 is a schematic, cross-sectional diagram showing a touch panel according to an eighth preferred embodiment of the present invention.

FIG. 10 is a schematic, cross-sectional diagram showing a touch panel according to an eighth preferred embodiment of the present invention. One difference between the fourth preferred embodiment and the eighth preferred embodiment is that the substrate 42 and the second sensing structure 29 are both disposed under the non-transparent layer 38. The rest of the parts disclosed in this embodiment, as well as the characteristics of other parts, material properties and the way of fabricating are almost similar to those described in the first preferred embodiment. For the sake of brevity, these similar configurations and properties are therefore not disclosed again in detail.

In order to simplify the fabricating processes, when the second sensing structure 29 and the non-transparent layer 38 are adjacent along a vertical direction, such as the structures shown in the second, third, sixth and, seventh embodiments, the connection lines 34 and, the non-transparent layer 38 of the first sensing structure 19 and the second sensing structure 29 may comprise the same material and may be fabricated during the same fabricating processes. Preferably, the material of the connection lines 34 and the non-transparent layer 38 is an opaque conducting material. Furthermore, in another case, the connection lines 34 and the non-transparent layer 38 of the first sensing structure 19 and, the second sensing structure 29 and the conductive lines 40 of the touch panel 10 may comprise the same material and may be fabricated during the same fabricating processes. In this condition, the material of the connection lines 34, the non-transparent layer 38 and the conductive lines 40 is preferably an opaque metal with good conducting properties. The main fabricating process may include the following steps. First, a metal layer may be formed within the peripheral region 18. Then the conductive lines 40, the connection lines of the first sensing structure 19 and the second sensing structure 29, the non-transparent layer 38 surrounding the first pattern may be formed concurrently through etching processes or the like. At this time, the conductive lines 40 are within the shelter layer 22. Additionally, in order to prevent the first pattern 24 from being sheltered by the surrounding non-transparent layer 38, a second pattern 25 is formed on the non-transparent layer 38. Since the second pattern 25 is overlapped, by the first pattern 24, light beams from the light source can therefore easily pass through the first pattern 24. Since, the non-transparent layer 38 is a conducting metal layer, when there is no isolation layer between the non-transparent layer 38 and the second sensing structure 29, conductive units in different axis electrodes will be electrically connected. In order to solve this drawback, according to this embodiment, a third pattern (not shown) is formed in the non-transparent layer 38 through an etching process. A space between each conductive unit of the second sensing structure 29 is a fourth pattern (not shown). The third pattern is overlapped by the fourth pattern. In this way, no conductive material will be disposed between the conductive units where electrical isolation is required.

To summarize, the present invention, provides a touch panel having a non-transparent layer disposed between a light source and a shelter layer. The non-transparent layer is used to prevent light beams from being transmitted through pinholes of the shelter layer and let the pinholes be hardly visible to the eyes. Furthermore, the structure disclosed in the present invention may also be integrated into conventional touch panels or touch panels with Touch On Lens structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising: a protective cover having a lower surface, wherein the lower surface comprises an active region and a peripheral region surrounding the active region; a first sensing structure disposed within the active region; a shelter layer disposed within the peripheral region, wherein the shelter layer comprises at least one highlight region and a highlight contrast region; and a non-transparent layer disposed within the highlight region and having a non-hollow portion, wherein the shelter layer comprises a first pattern and a portion not corresponding to the first pattern within each of the highlight regions, and wherein the first pattern is a hollow portion of the shelter layer, and the portion not corresponding to the first pattern is a non-hollow portion of the shelter layer and is overlaid by the non-hollow portion of the non-transparent layer; and wherein the non-transparent layer comprises a second pattern within the highlight region, wherein the second pattern is a hollow portion of the non-transparent layer and is overlapped by the corresponding first pattern.

2. The touch panel according to claim 1, further comprising a second sensing structure disposed between the protective cover and the shelter layer, wherein the second sensing structure is disposed on the shelter layer within the highlight region.

3. The touch panel according to claim 2, further comprising a substrate disposed between the shelter layer and the non-transparent layer, wherein the first sensing structure is formed on the substrate.

4. The touch panel according to claim 1, further comprising a second sensing structure disposed between the shelter layer and the non-transparent layer, wherein the second sensing structure is disposed corresponding to the highlight region.

5. The touch panel according to claim 4, further comprising a substrate disposed under the non-transparent layer, wherein the first sensing structure is formed on the substrate, and the second sensing structure is formed on the non-transparent layer.

6. The touch panel according to claim 4, further comprising a substrate disposed between the second sensing structure and the non-transparent layer, wherein the first sensing structure and the second sensing structure are formed on the substrate.

7. The touch panel according to claim 1, further comprising a second sensing structure disposed under the non-transparent layer corresponding to the highlight region of the shelter layer.

8. The touch panel according to claim 7, further comprising a substrate disposed under the second sensing structure, wherein the first sensing structure and the second sensing structure are formed on the substrate.

9. The touch panel according to claim 1, further comprising an adhesive layer disposed between the first sensing structure and the protective cover.

10. The touch panel according to claim 1, further comprising a second sensing structure, wherein the first sensing structure and the second sensing structure are located on the same level and are in electrical in contact with each other.

11. The touch panel according to claim 1, wherein the first sensing structure comprises: a first axis electrode; a second axis electrode, wherein the second axis electrode comprises a plurality of conductive units with at least a connection line electrically connecting two adjacent conductive units; and a plurality of conductive lines electrically connected to the first axis electrode and the second axis electrode respectively.

12. The touch panel according to claim 11, wherein the connection line and the non-transparent layer comprise a same material.

13. The touch panel according to claim 11, wherein the connection line, the non-transparent layer and the conductive lines comprise a same material.

14. The touch panel according to claim 11, wherein the conductive lines are disposed within the region where the shelter layer is disposed.

15. The touch panel according to claim 4, wherein the non-transparent layer further comprises a third pattern, the second sensing structure comprises a conductive layer having a fourth pattern, wherein the third pattern is overlapped by the fourth pattern.

16. The touch panel according to claim 1, wherein the first sensing structure is directly disposed on the lower surface of the protective cover.

17. The touch panel according to claim 1, wherein the shelter layer is disposed on the lower surface of the protective layer.

18. The touch panel according to claim 1, wherein the non-transparent layer is disposed on the shelter layer.

19. The touch according to claim 1, wherein the second pattern has the same size as that of the first pattern.

20. The touch panel according to claim 1, wherein the second pattern has the same shape as that of the corresponding first pattern, and the non-hollow portion of the non-transparent layer has the same shape as that of the non-hollow portion of the shelter layer within the corresponding highlight region.

* * * * *